US010049632B2

(12) United States Patent
Suzuki

(10) Patent No.: US 10,049,632 B2
(45) Date of Patent: *Aug. 14, 2018

(54) SEMICONDUCTOR DEVICE, LIQUID CRYSTAL DISPLAY PANEL, AND MOBILE INFORMATION TERMINAL

(71) Applicant: Renesas Electronics Corporation, Koutou-ku, Tokyo (JP)

(72) Inventor: Shinya Suzuki, Itami (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/663,630

(22) Filed: Jul. 28, 2017

(65) Prior Publication Data

US 2017/0330524 A1 Nov. 16, 2017

Related U.S. Application Data

(63) Continuation of application No. 15/338,613, filed on Oct. 31, 2016, now Pat. No. 9,747,855, which is a (Continued)

(30) Foreign Application Priority Data

Nov. 24, 2010 (JP) ................................ 2010-260753

(51) Int. Cl.
*G09G 3/36* (2006.01)
*H01L 27/02* (2006.01)
(Continued)

(52) U.S. Cl.
CPC ....... *G09G 3/3655* (2013.01); *G02F 1/13306* (2013.01); *G02F 1/136204* (2013.01); (Continued)

(58) Field of Classification Search
CPC ........... G02F 1/13306; G02F 1/136204; G02F 2001/133302; G09G 2300/0426; (Continued)

(56) References Cited

U.S. PATENT DOCUMENTS 7,750,373 B2 7/2010 Taniguchi et al.
8,017,999 B2 9/2011 Suzuki
(Continued)

FOREIGN PATENT DOCUMENTS

JP 4-127556 A 4/1992
JP 2005-252095 A 9/2005
(Continued)

OTHER PUBLICATIONS

Office Action dated Dec. 18, 2014, in Japanese Patent Application No. 2010-260753.
(Continued)

*Primary Examiner* — Tony Davis
(74) *Attorney, Agent, or Firm* — Shapiro, Gabor and Rosenberger, PLLC

(57) ABSTRACT

A semiconductor device includes a plurality of sets of external drive terminals in a marginal region along one long side of a rectangular semiconductor substrate, a plurality of sets of ESD protection circuits arranged in the marginal region and coupled to corresponding sets of the drive terminals, and a plurality of output circuits coupled to corresponding sets of the drive terminals. Each set of drive terminals in a plurality of n columns along a Y direction is laid out in a staggered arrangement with drive terminals in adjacent columns shifted relative to each other. Each output circuit includes n output units associated with n drive terminals of each set and arranged in one column in an X direction. By the arrangement, the drive terminals can be (Continued)

arranged at a narrower pitch, and the total width for n output units can be compacted into that of one output circuit.

3 Claims, 7 Drawing Sheets

Related U.S. Application Data continuation of application No. 14/556,959, filed on Dec. 1, 2014, now Pat. No. 9,501,986, which is a continuation of application No. 13/295,054, filed on Nov. 12, 2011, now Pat. No. 8,913,047.

(51) Int. Cl.
    *G02F 1/1362* (2006.01)
    *G02F 1/133* (2006.01)
    *G02F 1/1333* (2006.01)
(52) U.S. Cl.
    CPC ......... *G09G 3/3614* (2013.01); *G09G 3/3648* (2013.01); *G09G 3/3688* (2013.01); *H01L 27/0296* (2013.01); *G02F 2001/133302* (2013.01); *G09G 2300/0426* (2013.01); *G09G 2310/027* (2013.01); *G09G 2310/0281* (2013.01); *G09G 2310/0297* (2013.01); *G09G 2330/04* (2013.01)
(58) Field of Classification Search
    CPC ..... G09G 2310/027; G09G 2310/0281; G09G 2310/0297; G09G 2330/04; G09G 3/3614; G09G 3/3648; G09G 3/3655; G09G 3/3688; H01L 27/0296
    USPC ......................................................... 345/212
    See application file for complete search history.

(56) References Cited

U.S. PATENT DOCUMENTS

| 8,547,773 | B2 |  | 10/2013 | Saiki et al. |
| 8,913,047 | B2 | * | 12/2014 | Suzuki ................ G09G 3/3614 345/204 |
| 9,501,986 | B2 | * | 11/2016 | Suzuki ................ G09G 3/3614 |
| 2002/0054006 | A1 |  | 5/2002 | Tsuyuki et al. |
| 2004/0150596 | A1 |  | 8/2004 | Uchida et al. |
| 2004/0188848 | A1 |  | 9/2004 | Nojiri |
| 2006/0180864 | A1 |  | 8/2006 | Suzuki |
| 2007/0001886 | A1 |  | 1/2007 | Ito et al. |
| 2007/0080416 | A1 |  | 4/2007 | Yoshioka et al. |
| 2007/0109484 | A1 |  | 5/2007 | Murahashi et al. |
| 2008/0157124 | A1 |  | 7/2008 | Taniguchi |
| 2012/0127149 | A1 | * | 5/2012 | Suzuki ................ G09G 3/3614 345/212 |
| 2012/0153367 | A1 |  | 6/2012 | Ogura |
| 2015/0084846 | A1 | * | 3/2015 | Suzuki ................ G09G 3/3614 345/87 |

FOREIGN PATENT DOCUMENTS

| JP | 2007-243125 A | 9/2007 |
| JP | 2007-243128 A | 9/2007 |
| JP | 2007-316604 A | 12/2007 |
| JP | 2008-041982 A | 2/2008 |
| JP | 2008-085184 A | 4/2008 |
| JP | 2008-166495 A | 7/2008 |

OTHER PUBLICATIONS

Office Action dated May 1, 2014, in Japanese Patent Application No. 2010-260753.

* cited by examiner

SEMICONDUCTOR DEVICE, LIQUID CRYSTAL DISPLAY PANEL, AND MOBILE INFORMATION TERMINAL

CROSS-REFERENCE TO RELATED APPLICATIONS

The disclosure of Japanese Patent Application No. 2010-260753 filed on Nov. 24, 2010 including the specification, drawings and abstract is incorporated herein by reference in its entirety.

BACKGROUND

The present invention relates to a semiconductor device having a large number of juxtaposed external drive terminals and, moreover, a liquid crystal display panel and a mobile information terminal equipped with such semiconductor device as a display driver, and also relates to a technique that is effectively applied to, for example, a mobile phone equipped with a small and high-definition liquid crystal display.

In an active matrix type liquid crystal display, the switching gates of a large number of thin-film transistors arranged in a matrix are turned on sequentially per scan line in accordance with horizontal synchronization timing, a driving voltage is supplied from source lines to the turned on thin-film transistors and thus applied to sub-pixels. This active matrix type liquid crystal display is widely used in a variety of mobile information terminals or the like typified by mobile phones and, as its display definition is enhanced to a higher definition, the number of external drive terminals increases. If the number of these external drive terminals increases, the external drive terminals of a liquid crystal display driver that drives the liquid crystal display have to be laid out at a narrower pitch. For example, when a liquid crystal display driver formed over a rectangular semiconductor substrate is placed along an edge of a liquid crystal display, as the number of source electrode lines which are led out from the edge of the liquid crystal display increases due to enhanced definition of the display, it becomes necessary to increase the number of external drive terminals to be formed in line with a long side of the liquid crystal display driver because of size limitation of the liquid crystal display driver.

Patent Document 1 describes laying out a plurality of arrays of both I/O pads as external terminals and I/O circuits coupled to the I/O pads in edge regions of a chip and enabling an increase in the number of I/O pads and I/O circuits of a semiconductor integrated circuit. It also mentions that the I/O pads are laid out in a staggered arrangement.

Patent Document 2 describes laying out input/output circuits which increase with increasing external terminals in a staggered arrangement, so that this arrangement can provide sufficient space for laying out the input/output circuits.

RELATED ART DOCUMENTS

Patent Documents

[Patent Document 1] Japanese Unexamined Patent Publication No. 2005-252095
[Patent Document 2] Japanese Unexamined Patent Publication No. Hei

SUMMARY

However, the techniques of the foregoing Patent Documents are incapable of sufficiently meeting a requirement that external terminals should be arranged at a narrower pitch due to an increase in the number of external terminals. As described in Patent Document 1, the arrangement in which each set of I/O pads in a plurality of columns or rows is laid out in a staggered arrangement is applicable only if the width of an I/O circuit is smaller than a minimum pitch for the I/O pads. As described in Patent Document 2, the arrangement in which each set of I/O circuits in a plurality of columns or rows is laid out in a staggered arrangement is applicable if the width of an I/O circuit is larger than a minimum pitch for I/O pads, but the pitch for the I/O pads is restricted to a dimension that is 1.5 times as much as the width dimension of an I/O circuit.

An object of the present invention is to provide a semiconductor device that sufficiently complies with a requirement that external drive terminals should be arranged at a narrower pitch.

Another object of the present invention is to provide a liquid crystal display panel and, moreover, a mobile information terminal featuring a narrower pitch array of external drive terminals of a semiconductor device for driving pixels of a display to enable size reduction in order to meet size reduction and enhanced definition of the display.

The above-noted and other objects and novel features of the present invention will become apparent from the description of the present specification and the accompanying drawings.

A typical aspect of the invention disclosed in this application is outlined as follows.

There is provided a semiconductor device including a plurality of sets of external drive terminals arranged in a marginal region along one long side of a rectangular semiconductor substrate; a plurality of sets of ESD protection circuits also arranged in the marginal region and coupled to the corresponding sets of the external drive terminals; and a plurality of output circuits coupled to the corresponding sets of the external drive terminals. The sets of the external drive terminals are arranged such that each set of the external drive terminals in a plurality of n columns along a Y direction is laid out in a staggered arrangement in which the positions of the external drive terminals in adjacent columns are shifted with respect to each other. Each of the output circuits includes n output units associated with n external drive terminals of each set and arranged in one column in an X direction perpendicular to the Y direction.

Accordingly, by the staggered arrangement in n columns, the external drive terminals can be arranged at a narrower pitch. In each output circuit which is associated with each set of n external drive terminals, by locating n output units arranged in one column in the X direction, the total width for n output units can be compacted into the width of one output circuit. It is thus possible to reduce the layout width of an output circuit constrained by laying out the external drive terminals at a narrower pitch.

Effect obtained by the typical aspect of the invention disclosed in the present application is outlined below.

It is possible to sufficiently comply with the requirement that the external drive terminals of the semiconductor device should be arranged at a narrower pitch. An inventive feature in terms of narrower pitch layout of the external drive terminals of the semiconductor device for driving pixels of the display can contribute to the realization of a smaller liquid crystal display panel and, moreover, a smaller mobile information terminal in order to meet size reduction and enhanced definition of the display.

DETAILED DESCRIPTION

1. General Description of Embodiments

Figure 1:
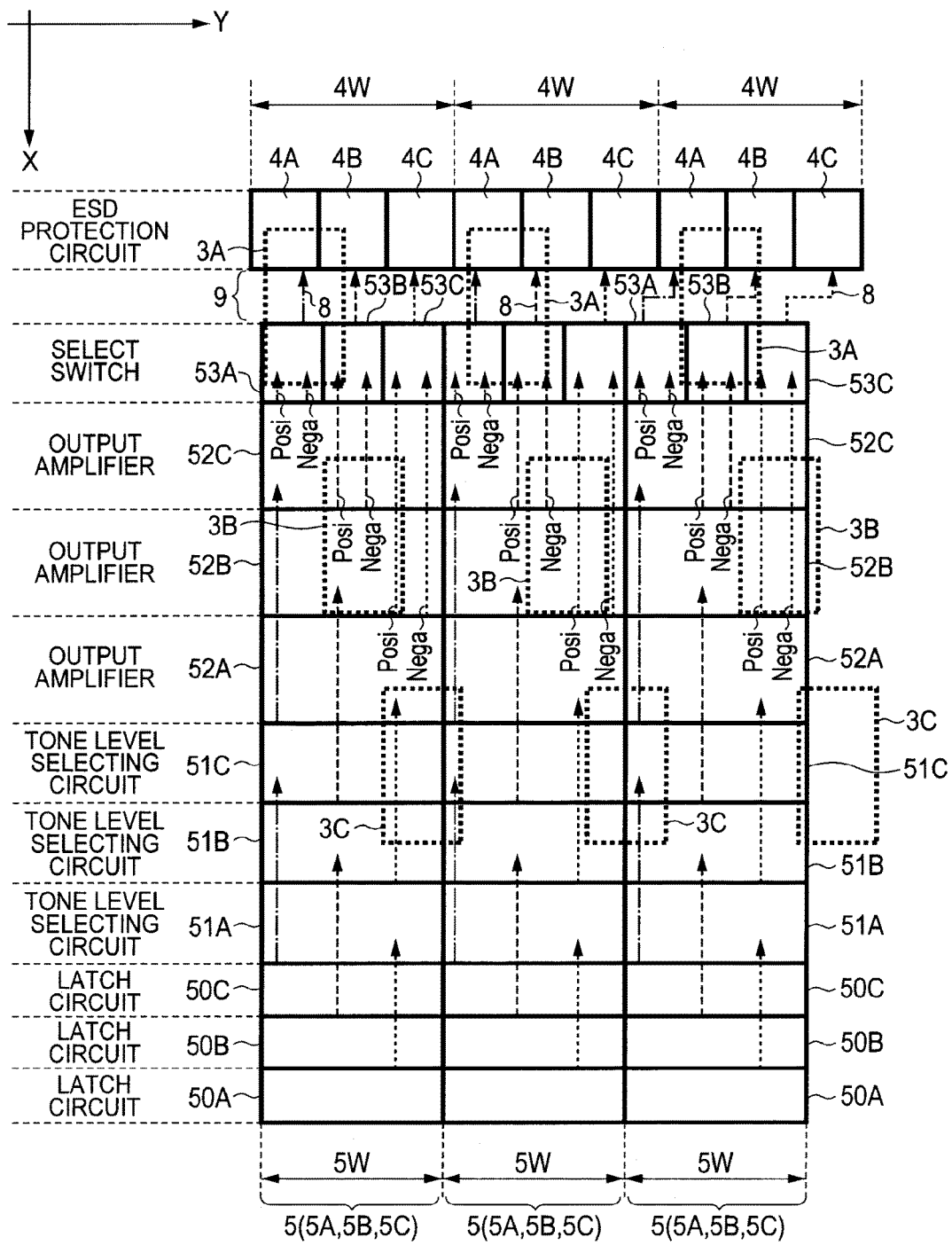
FIG. 1 is a layout diagram illustrating details on relative layouts of external drive terminals, ESD protection circuits, and output circuits in a liquid crystal display driver as one embodiment of the present invention.

To begin with, exemplary embodiments of the invention disclosed herein are outlined. In the following general description of exemplary embodiments, reference designators in the drawings, which are given for referential purposes in parentheses, are only illustrative of elements that fall in the concepts of the components identified by the designators.

[1] <Staggered arrangement of each set of external drive terminals in a plurality of columns and arrangement of output units in a plurality of columns> A semiconductor device (1) pertaining to an exemplary embodiment of the present invention includes a plurality of sets of external drive terminals (3A to 3C, 3mA to 3mB) arranged in a marginal region along one long side of a rectangular semiconductor substrate; a plurality of sets of ESD protection circuits (4A to 4C, 4mA to 4mB) also arranged in the marginal region and coupled to the corresponding sets of the external drive terminals; a plurality of output circuits (5, 5m) coupled to the corresponding sets of the external drive terminals; and a processing circuit (6) formed over the semiconductor substrate to control output operation of the output circuits. The sets of the external drive terminals are arranged such that each set of the external drive terminals in a plurality of n columns along a Y direction is laid out in a staggered arrangement in which the positions of the external drive terminals in adjacent columns are shifted with respect to each other. Each of the output circuits includes n output units (5A to 5C, 5mA to 5mB) associated with n external drive terminals of each set and arranged in one column in an X direction perpendicular to the Y direction.

Accordingly, by the staggered arrangement in n columns, the external drive terminals can be arranged at a narrower pitch. In each output circuit which is associated with each set of n external drive terminals, by locating n output units arranged in one column in the X direction, the total width for n output units can be compacted into the width of one output circuit. It is thus possible to reduce the layout width of an output circuit constrained by laying out the external drive terminals at a narrower pitch.

[2] <Output units in even width> In the semiconductor device as set forth in [1], n output units arranged in one column in the X direction are arranged in order in an even width in the X direction.

Forming n output units in a region with a predetermined width is facilitated.

[3] <Layered configuration> In the semiconductor device as set forth in [2], a region where the ESD protection circuits and the output circuits are formed is located underneath a region where the external drive circuits are arranged in a layered configuration.

It is possible to improve the efficiency of laying out circuit elements over a semiconductor substrate.

[4] <Making the output circuit width smaller than the layout width for each set of external drive terminals> In the semiconductor device as set forth in [1], a width dimension (5W, 5mW) in the Y direction of each of the output circuits is smaller than a width dimension (4W, 4mW) of each set of n external drive terminals arranged along the X direction.

It will be easy to reserve a surplus region for locating another circuit in a space provided between the arrays of output circuits laid out in the Y direction.

[5] <Column-wise alignment of the ESD protection circuits arranged with the external drive terminals arranged> In the semiconductor device as set forth in [4], the ESD protection circuits of each set are juxtaposed in the Y direction at a pitch that is equal to a layout pitch in the Y direction for the external drive terminals of each set laid out in the n columns along the Y direction.

Since the ESD protection circuits can be arranged near the external drive terminals, it is possible to make assurance doubly sure on protection against ESD (Electrostatic Discharge).

[6] <Wiring region> The semiconductor device as set forth in [5] further includes a wiring region (9) for coupling corresponding ones of the external drive terminals and output units between an array region of the ESD protection circuits along the Y direction and an array region of the output units along the Y direction.

When the ESD protection circuits have been arranged near the external drive terminals, it will be easy to route wiring lines for coupling the output circuits to the corresponding external drive terminals.

[7] <Extending a region for forming an internal circuit> The semiconductor device as set forth in [4] has array regions of the output circuits extending from a center part of the semiconductor substrate toward right and left sides of the substrate along the Y direction and a part of the processing circuit is formed in a space (6A) between the right and left array regions of the output circuits.

A surplus region between the right and left array regions of the output circuits in the Y direction can be used effectively for locating the processing circuit and it is possible to improve the layout efficiency for locating circuits all over the semiconductor substrate.

[8] <Host interface> The semiconductor device as set forth in [1] further includes a plurality of external interface terminals (7) arranged in a marginal region along the other long side of the semiconductor substrate and the external interface terminals are coupled to the processing circuit.

Host interface with the processing circuit, among others, can be implemented via the external interface terminals.

[9] <Pitch for the external interface terminals and pitch for the external drive terminals> In the semiconductor device as set forth in [8], a layout pitch for the external drive terminals is smaller than a layout pitch for the external interface terminals.

As for external terminals not required to be laid out at a narrower pitch, there is no need for the above-described considerations with regard to the external drive terminals.

[10] <Output units that drive source electrodes of liquid crystal display> In the semiconductor device as set forth in [9], the external drive terminals are terminals for driving source electrodes of an active matrix type liquid crystal display (111). Each of the output units includes a latch circuit (50A to 50C, 50mA to 50mB) that latches display data supplied from the processing circuit, atone level selecting circuit (51A to 51C, 51mA to 51mB) that decodes display data latched by the latch circuit and selects a tone level voltage signal, an output amplifier (52A to 52C, 52mA to 52mB) that amplifies a tone level voltage signal output from the tone level selecting circuit, and a select switch (53A to 53C, 53mA to 53mB) that selects either an output with a polarity from the output amplifier or an output with an opposite polarity from another output unit's output amplifier and outputs the selected output to a corresponding one of the external drive terminals.

It is possible to allow for narrower pitch layout of the external drive terminals of the semiconductor device for use to drive a smaller and higher-definition liquid crystal display.

[11] <Liquid crystal display panel> A liquid crystal display panel (104) pertaining to another embodiment of the present invention includes an active matrix type liquid crystal display (111) formed over a glass substrate (110); a plurality of source electrode lines (112) led out from the active matrix type liquid crystal display and formed over the glass substrate; and a liquid crystal display driver (1), as a semiconductor integrated circuit, coupled to the source electrode lines and mounted over the glass substrate. The liquid crystal display driver includes a plurality of sets of external drive terminals arranged in a marginal region along one long side of a rectangular semiconductor substrate, the one long side facing an edge of the active matrix type liquid crystal display; a plurality of sets of ESD protection circuits also arranged in the marginal region and coupled to the corresponding sets of the external drive terminals; a plurality of output circuits coupled to the corresponding sets of the external drive terminals; and a processing circuit formed over the semiconductor substrate to control output operation of the output circuits. The sets of the external drive terminals are arranged such that each set of the external drive terminals in a plurality of n columns along a Y direction is laid out in a staggered arrangement in which the positions of the external drive terminals in adjacent columns are shifted with respect to each other. Each of the output circuits includes n output units associated with n external drive terminals of each set and arranged in one column in an X direction perpendicular to the Y direction.

Because, as is evident from the foregoing description, it is possible to sufficiently comply with the requirement that the external drive terminals of the liquid crystal display driver should be arranged at a narrower pitch, the inventive feature in terms of narrower pitch layout of the external drive terminals of the semiconductor device for driving pixels of the display can contribute to the realization of a smaller liquid crystal display panel in order to meet size reduction and enhanced definition of the liquid crystal display.

[12] <Mobile information terminal> A mobile information terminal (100) pertaining to another embodiment of the present invention includes an input unit (102) ; a data processing unit (103) that performs data processing according to an input signal from the input unit; and a display unit (104) for display under control of the data processing unit in the mobile information terminal's casing (101). The display unit includes a display (111); electrode lines (112) led out from the display; and a display driver (1) coupled to the electrode lines on its one side and coupled to the data processing unit on its other side. The display driver includes a plurality of sets of external drive terminals arranged in a marginal region along one long side of a rectangular semiconductor substrate, the one long side facing an edge of the display; a plurality of sets of ESD protection circuits also arranged in the marginal region and coupled to the corresponding sets of the external drive terminals; a plurality of output circuits coupled to the corresponding sets of the external drive terminals; and a processing circuit formed over the semiconductor substrate to control output operation of the output circuits. The sets of the external drive terminals are arranged such that each set of the external drive terminals in a plurality of n columns along a Y direction is laid out in a staggered arrangement in which the positions of the external drive terminals in adjacent columns are shifted with respect to each other. Each of the output circuits includes n output units associated with n external drive terminals of each set and arranged in one column in an X direction perpendicular to the Y direction.

Because, as is evident from the foregoing description, it is possible to sufficiently comply with the requirement that the external drive terminals of the liquid crystal display driver should be arranged at a narrower pitch, the inventive feature in terms of narrower pitch layout of the external drive terminals of the semiconductor device for driving pixels of the display can contribute to the realization of a smaller mobile information terminal in order to meet size reduction and enhanced definition of the liquid crystal display.

[13] <Mobile phone> The mobile information terminal as set forth in [12] further includes a communication processing unit that implements mobile communication control based on control of the data processing unit.

The mobile information terminal can be implemented as a mobile phone.

2. Details on Embodiments

Embodiments of the invention will now be described in greater detail.

First Embodiment

Figure 2:
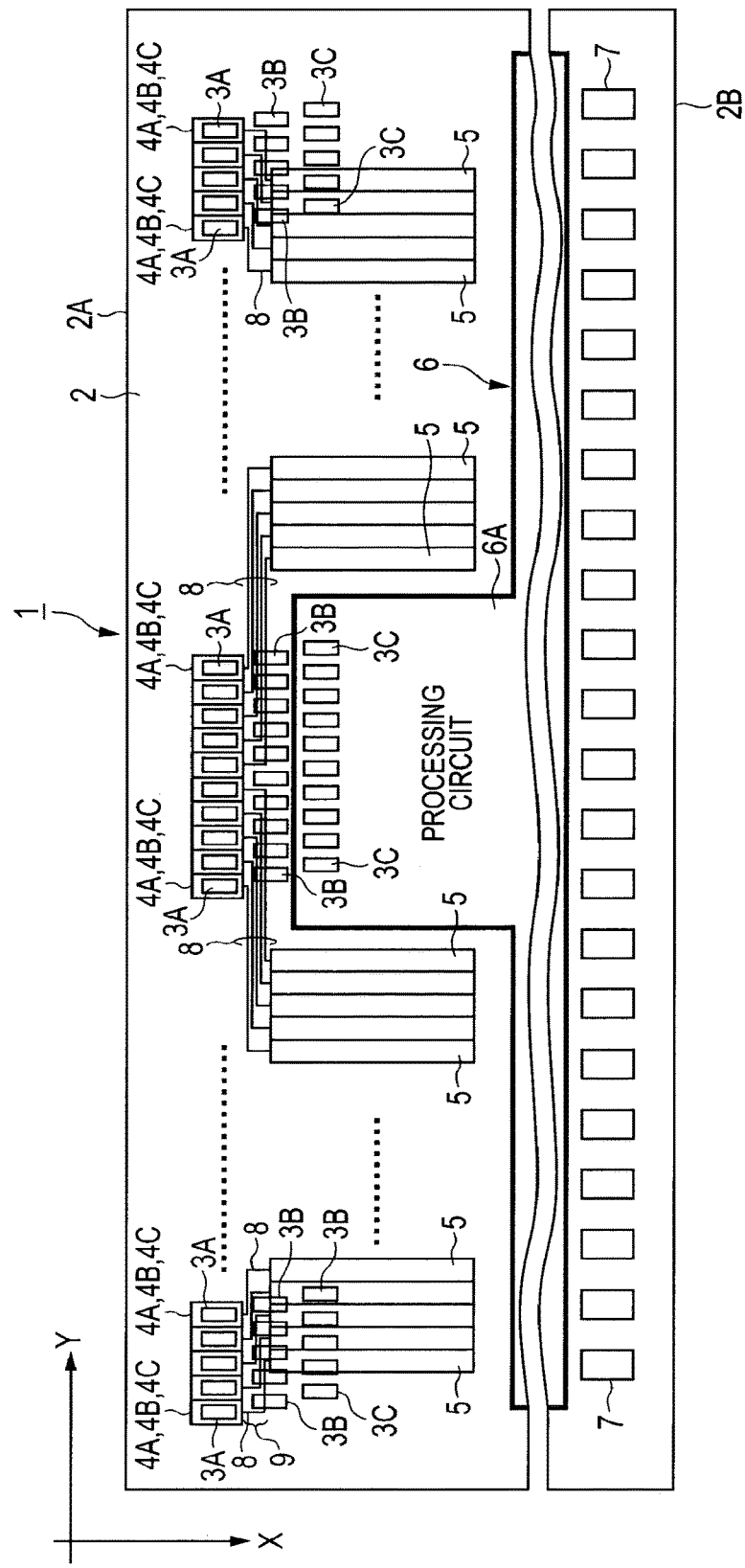
FIG. 2 is a layout diagram schematically depicting a chip layout structure of the liquid crystal display driver as one embodiment of the present invention.

FIG. 2 schematically depicts a chip layout structure of a liquid crystal display driver as one embodiment of the present invention. The liquid crystal display driver 1 shown in FIG. 2 is, for example, formed over a single semiconductor substrate 2 such as a monocrystalline silicon substrate by a CMOS integrated circuit or Bi-CMOS integrated circuit manufacturing technology known to the public.

The semiconductor substrate 2 has a rectangular shape and, in a marginal region of one long side 2A thereof, a plurality of sets of external drive terminals 3A, 3B, 3C are arranged such that, each set of the external drive terminals in a plurality of columns, for example, three columns along a Y direction parallel to the long side is laid out in a staggered arrangement in which the positions of the external drive terminals 3A, 3B, 3C in adjacent columns are shifted with respect to each other. These sets of the external drive terminals 3A, 3B, 3C, for example, serve as terminals that drive source lines of an active matrix type liquid crystal display. In edge sections of the marginal region of the long side 2A of the semiconductor substrate 2 in the Y direction, terminals that drive gate lines of the liquid crystal display, ESD protection circuits, and output circuits are arranged, though they are not shown here. The external drive terminals 3A, 3B, 3C are formed, for example, by solder bump electrodes.

In the vicinity of the array of the thus arranged external drive terminals 3A, 3B, 3C, a plurality of sets of ESD protection circuits 4A, 4B, 4C coupled to the corresponding sets of the external drive terminals 3A, 3B, 3C and a plurality of output circuits 5 coupled to the corresponding sets of the external drive terminals 3A, 3B, 3C are arranged along the same Y direction. To simplify diagrammatic representation, in FIG. 2, one rectangle representing ESD protection circuits 4A, 4B, 4C represents a collection of three ESD protection circuits 4A, 4B, 4C for convenience sake. Each output circuit 5 includes three output units respectively associated with three external drive terminals 3A, 3B, 3C. Details on the output units will be described later based on FIG. 1.

A layout pitch for the output circuits 5 is smaller than layout pitches for the ESD protection circuits 4A, 4B, 4C and the external drive terminals 3A, 3B, 3C. Accordingly, the output circuits 5 are arranged in right and left side arrays between which a central empty space is provided. This empty space region is incorporated in a part 6A of a circuit area of a processing circuit 6 that is formed in the center part of the semiconductor substrate 2. Although not restrictive, the processing circuit 6, in accordance with commands, stores display data which is supplied from outside into a fame buffer, outputs and provides the display data from the frame buffer to the output circuits 5, and causes the output circuits 5 to output source line drive signals from the external drive terminals 3A, 3B, 3C in sync with horizontal scan timing, and, moreover, controls switching and driving of gate lines which are sequentially selected in sync with horizontal scan timing.

Due to the fact that the layout pitch for the output circuits 5 is smaller than the layout pitches for the ESD protection circuits 4A, 4B, 4C and the external drive terminals 3A, 3B, 3C, it is needed to route wiring 8 for coupling the output circuits 5 to the ESD protection circuits 4A, 4B, 4C of the corresponding external drive terminals 3A, 3B, 3C in the Y direction as well as the X direction. Taking this into consideration, a wiring region 9 for such wiring is provided between the ESD protection circuits 4A, 4B, 4C and the output circuits 5. Details on this point will be described later.

A region where the ESD protection circuits 4A, 4B, 4C and the output circuits 5 are formed is located underneath a region where the external drive terminals 3A, 3B, 3C are arranged in a layered configuration with an intervening surface protection film or insulation film.

In a marginal region of the other long side 2B of the semiconductor substrate 2, external interface terminals 7 are arranged for interfacing with a data processing device such as a microcomputer. The data processing device performs data processing and the like for supplying display data to the liquid crystal display driver 1. Although not shown here, ESD protection circuits and input/output circuits corresponding to the external interface terminals 7 are arranged and the input/output circuits not shown here are coupled to the processing circuit 6. Although not restrictive, a layout pitch for the external interface terminals 7 is larger than the layout pitch for the external drive terminals 3A, 3B, 3C, considering that the requirement that terminals should be arranged at a narrower pitch is not so strict for the external interface terminals 7 that are coupled to a data processing device, as compared with the external drive terminals 3A, 3B, 3C.

FIG. 1 illustrates details on relative layouts of external drive terminals 3A, 3B, 3C. ESD protection circuits 4A, 4B, 4C, and output circuits 5. In FIG. 1, nine external drive terminals 3A, 3B, 3C, nine ESD protection circuits 4A, 4B, 4, and three output circuits 5 are shown by way of example.

One output circuit 5 has three output units 5A, 5B, 5C. Here, the external drive terminals 3A, 3B, 3C are terminals for driving source electrodes of the active matrix type liquid crystal display. The output units 5A, 5B, 5C, respectively, include latch circuits 50A, 508, 50C that latch display data supplied from the processing circuit 6, tone level selecting circuits 51A, 51B, 51C that decode the display data latched by the latch circuits 50A, 50B, 50C and select a tone level voltage signal, output amplifiers 52A, 52B, 52C that amplify tone level voltage signals which have been output from the tone level selecting circuits 51A, 51B, 51C, and select switches 53A, 53B, 53C that select one of the outputs with opposite polarities from two output amplifiers and output it to the corresponding external drive terminals 3A, 3B, 3C. The output unit 5A includes a latch circuit 50A, a tone level selecting circuit 51A, an output amplifier 52A, and a select switch 53A. The output unit 5B includes a latch circuit 50B, a tone level selecting circuit 51B, an output amplifier 52B, and a select switch 53B. The output unit 5C includes a latch circuit 50C, a tone level selecting circuit 51C, an output amplifier 52C, and a select switch 53C. Here, the output units 5A, 5B, 5C are not arranged on a per-unit basis; instead, component circuits of each output unit are arranged together on a per-function basis. For example, the select switches 53A to 53C are arranged in line in the Y direction, whereas the output amplifiers 52A, 52B, 52C, the tone level selecting circuits 51A, 51C, and the latch circuits 50A, 50B, 50C are arranged in line in the X direction in the mentioned order.

A large number of output circuits 5, each occupying one circuit cell, are laid out. One output circuit occupies a rectangular circuit cell having a width of 5W.

Also, a large number of ESD protection circuits 4A, 4B, 4C, each occupying one circuit cell, are laid out. Each ESD protection circuit 4A, 4B, 4C occupies a rectangular circuit cell and the width 4W of three ESD protection circuits is larger than the width 5W of the output circuit 5. The layout pitch for the ESD protection circuits 4A, 4B, 4C is equal to the layout pitch for the external drive terminals 3A, 3B, 3C. By this relationship, the output protection circuits and the external drive terminals which are mutually coupled are associated in one-to-one correspondence in the X direction within the range of the width of 4W. On the other hand, because 4W>5W, positional relationship between the output units 5A, 5B, 5C of the output circuits and the external drive terminals 3A, 3B, 3C which are mutually coupled is as follows: distance between an output unit and its corresponding external drive terminal gradually increases, as the number of array columns from base ends increases in the Y direction. FIG. 2 depicts the appearance of the array layout in which, when the right and left side ends of the semiconductor substrate are viewed as array base ends, the distance between the output units 5A, 5B, 5C of the output circuits 5 and the external drive terminals 3A, 38, 3C becomes father for array columns nearer to the center. As is apparent from FIG. 2, the routing distance in the Y direction of wiring lines 8 coupling the output units 5A, 5B, 5C of the output circuits 5 and the external drive terminals 3A, 3B, 3C becomes longer, the distance relative to each other becomes farther. The wiring region 9 for this purpose is provided between the ESD protection circuits and the select circuits.

Figure 3:
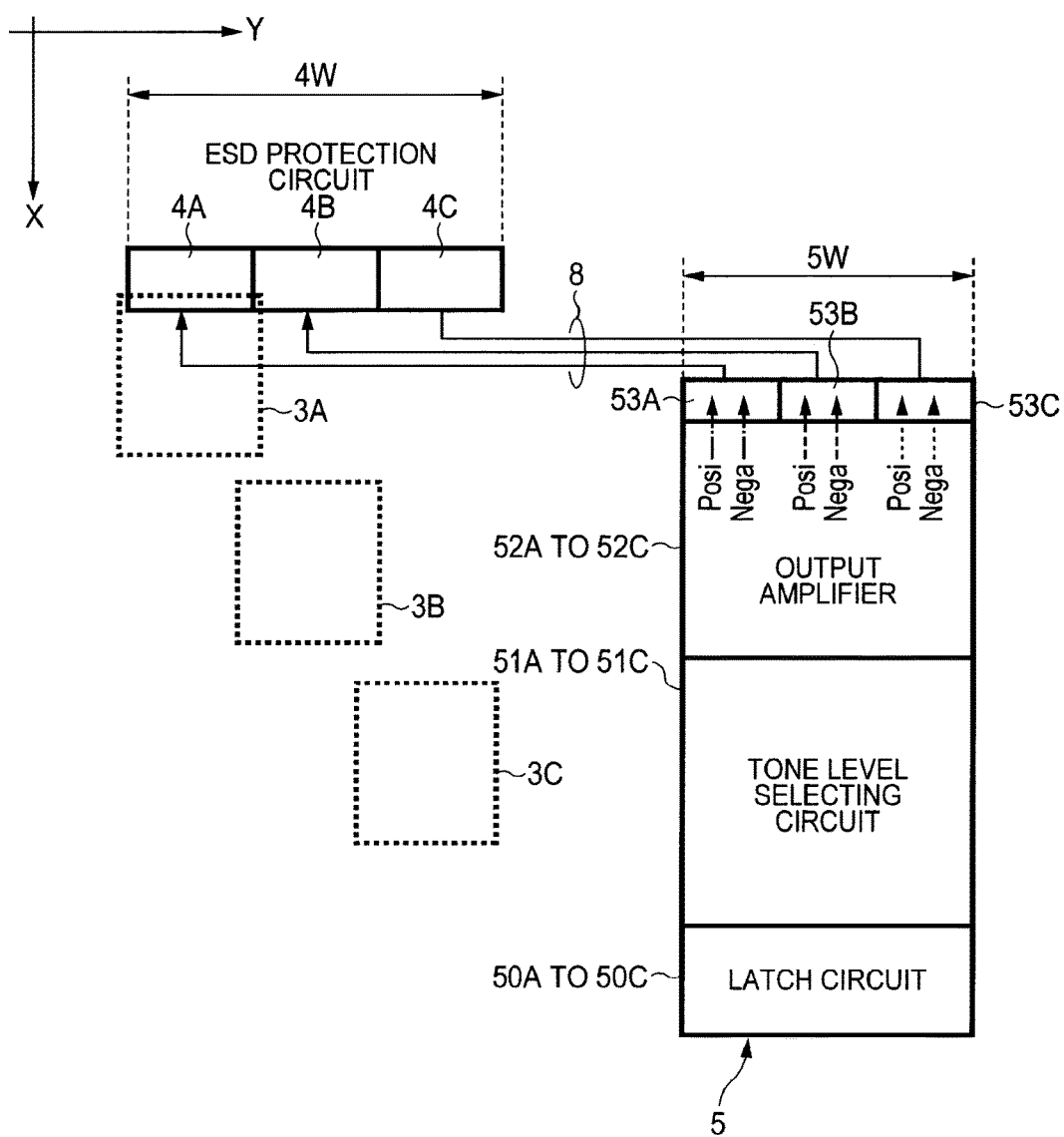
FIG. 3 is a layout diagram representatively illustrating a positional relationship in which a set of ESD protection circuits and an output circuit which are associated with each other are relatively far from each other in the Y direction.

FIG. 3 representatively illustrates a positional relationship in which ESD protection circuits 4A, 4B, 4C and an output circuit 5 which are associated with each other are relatively far from each other in the Y direction. In FIG. 3, the ESD protection circuits 4A, 4B, 4C and their corresponding external drive terminals 3A, 3B, 3C are coupled by wiring lines extending mostly in the X direction, which are, however, not shown, whereas the output circuit 5 which is associated with the ESD protection circuits 4A, 4B, 4C is far in the Y direction and, therefore, wiring lines thereto are routed long in the Y direction. As noted above, by making the layout pitch in the Y direction for the ESD protection circuits 4A, 4B, 4C equal to the layout pitch in the Y direction for the external drive terminals 3A, 3B, 3C and by making 4W>5W, a circuit region 6A is reserved. The wiring lines 8 are routed in the wiring region between the ESD protection circuits 4A, 4B, 4C and the switch circuits 53A, 53B, 53C. An ESD protection function is assured, as the external drive terminals 3A, 3B, 3C and the ESD protection circuits 4A, 4B, 4C which are located near to each other are coupled to each other, without regard to their layout positions in the Y direction. If the horizontal width of three ESD protection circuits 4A, 4B, 4C is reduced to 5W, the ESD protection circuits 4A, 4B, 4C are located near to the select switches 53A, 53B, 53C, but some of the ESD protection circuits 4A, 4B, 4C might become far from their corresponding external drive terminals 3A, 3B, 3C and there would be a risk that the ESD protection function cannot be achieved sufficiently.

Figure 7:
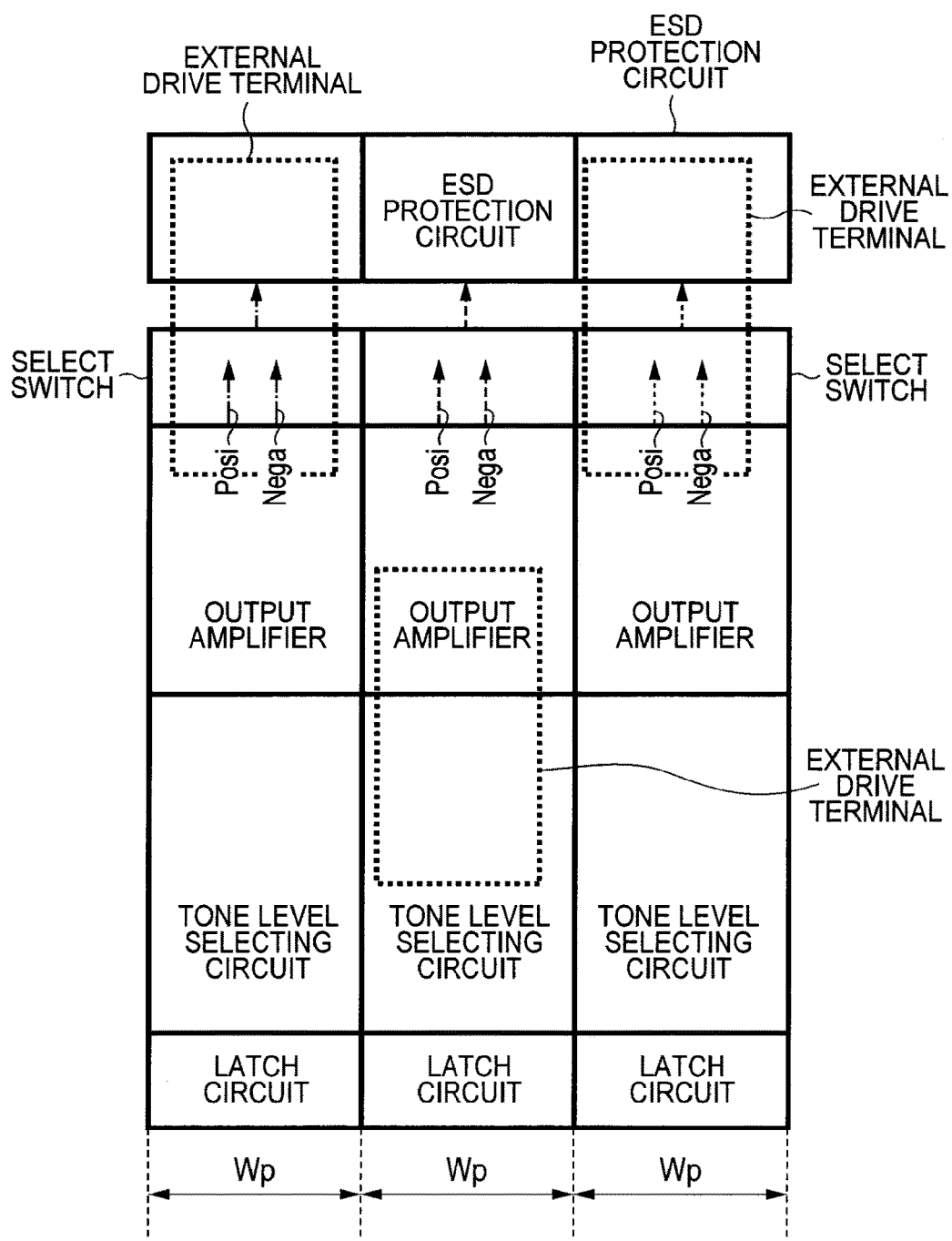
FIG. 7 is a plan view outlining a configuration as a comparison example in which one set of a select switch, an output amplifier, a tone level selecting circuit, and a latch circuit is associated with one external drive terminal and arranged in one column, even if external drive terminals are laid out in a staggered arrangement.

According to the above layout configuration, the external drive terminals 3A, 3B, 3C can be laid out at a narrower pitch by a staggered arrangement of each set of these terminals in three columns in the Y direction. In each output circuit 5 which is associated with each set of three external drive terminals 3A, 3B, 3C, by locating three output units 5A (50A, 51A, 52A, 53A), 5B (50B, 51B, 52B, 53B), and 5C (50C, 51C, 52C, 53C) arranged in one column in the X direction, the total width for three output units 5A can be compacted into the width (5W) of one output circuit. It is thus possible to reduce the layout width of an output circuit 5 constrained by laying out the external drive terminals 3A, 3B, 3C at a narrower pitch. Thereby, it is possible to sufficiently comply with the requirement that the external drive terminals 3A, 3B, 3C should be arranged at a narrower pitch in the liquid crystal display driver 1. As is shown in a comparison example of FIG. 7, even if external drive terminals are laid out in a staggered arrangement, however, in a configuration in which one set of a select switch, an output amplifier, a tone level selecting circuit, and a latch circuit is associated with one external drive terminal and arranged in one column, it is inevitable that the width Wp of such set becomes considerably larger than the widths 4W and 5W shown in FIG. 5 and the like.

In addition, because 4W>5W, it will be easy to reserve a surplus region 6A for locating another circuit in a space provided between the arrays of output circuits 5 laid out in the Y direction. By effective use of this surplus region 6A for locating the processing circuit 6, it is possible to improve the layout efficiency for locating circuits all over the semiconductor substrate.

Since the ESD protection circuits 4A, 4B, 4C can be arranged near the external drive terminals 3A, 3B, 3C, it is possible to make assurance doubly sure on protection against ESD. Because the wiring region 9 is then provided between the array region of the ESD protection circuits 4A, 4B, 4C and the select switches 53A, 53B, 53C, it will be easy to route wiring lines for coupling the output circuits 5 to the corresponding external drive terminals 3A, 3B, 3C.

Figure 4:
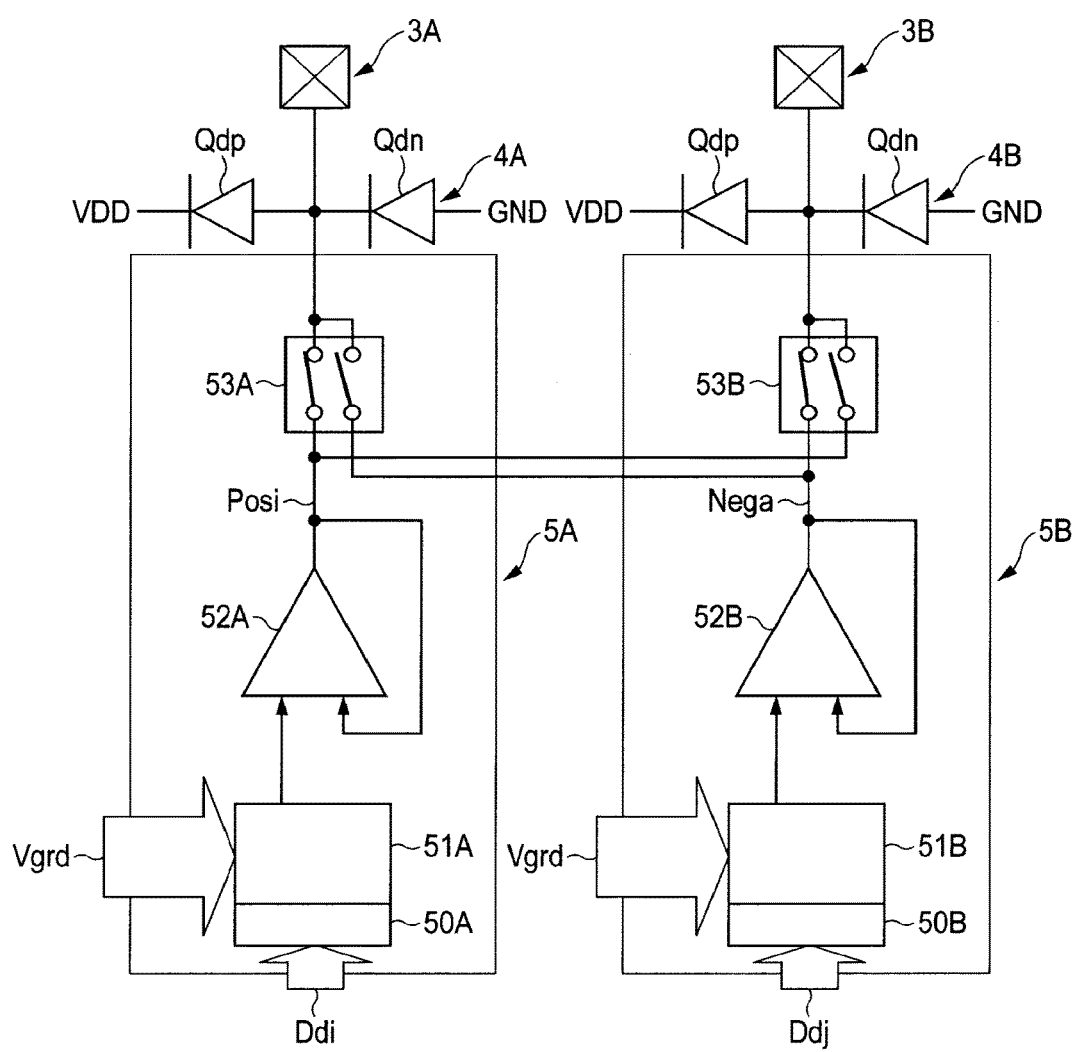
FIG. 4 is a circuit diagram illustrating a circuit configuration of output units of an output circuit.

As for external terminals not required to be laid out especially at a narrow pitch like the external interface terminals 7 that are used as host interface or system interface, there is no need for the above-described considerations with regard to the external drive terminals 3A, 3B, 3C FIG. 4 illustrates a circuit configuration of output units of an output circuit. The circuit configuration shown here assumes driving the liquid crystal display by alternating current drive such as line inversion driving or dot inversion driving. This figure representatively illustrates the configuration of output units 5A, 5B associated with a pair of adjacent external drive terminals 3A, 3B.

The ESD protection circuits 4A, 4B are configured with a p-channel type diode-coupled MOS transistor Qdp in which a source electrode is coupled to a gate electrode between the external drive terminal 3A, 3B and a power supply terminal VDD and an n-channel type diode-coupled MOS transistor Qdn in which a source electrode is coupled to a gate electrode between the external drive terminal 3A, 3B and a ground terminal GND.

The latch circuits 50A, 50B latch pixel data Ddi, Ddj for each corresponding pixel per horizontal scan timing and give the pixel data to the tone level selecting circuits 51A, 51B. The tone level selecting circuits 51A, 51B are each supplied with a plurality of tone level voltages Vgrd for a number of tone levels such as 256 tone levels. By decoding the pixel data Ddi, Ddj, the tone level selecting circuits 51A, 51B determine a tone level value and select and output one tone level voltage equivalent to the determined tone level value to the corresponding output amplifiers 52A, 52B. The output amplifier 52A amplifies and outputs a tone level voltage with positive polarity, whereas the output amplifier 52B amplifies and outputs a tone level voltage with negative polarity. Pois means an amplified tone level voltage output with positive polarity and Nega means an amplified tone level voltage output with negative polarity. The select switches 53A, 53B complementarily select one of the outputs of the output amplifies 52A, 52B in sync with horizontal scanning. Thereby, the select switch 53A selects one of the positive/negative outputs and the select switch 53A selects the other of the positive/negative outputs. By alternate switching between the selected output states (positive/negative), alternating current drive by dot inversion driving can be accomplished.

Second Embodiment

Figure 5:
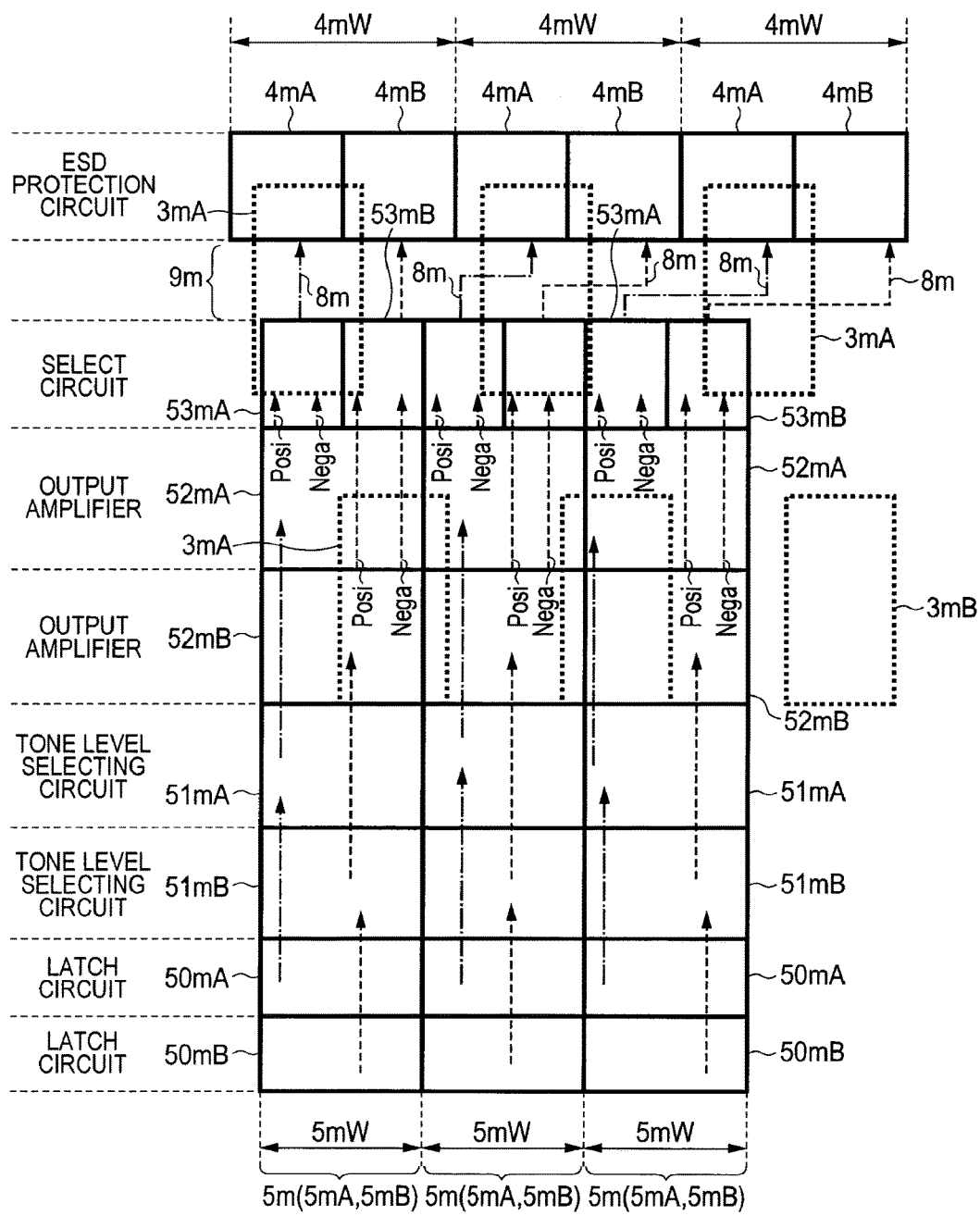
FIG. 5 is a layout diagram illustrating details on relative layouts of external drive terminals, ESD protection circuits, and output circuits, when each set of external drive terminals in two columns is laid out in a staggered arrangement as a second embodiment of the present invention.

FIG. 5 illustrates details on relative layouts of external drive terminals, ESD protection circuits, and output circuits, when each set of external drive terminals in two columns is laid out in a staggered arrangement as a second embodiment of the present invention. In FIG. 5, six external drive terminals 3mA, 3mB, six ESD protection circuits 4mA, 4mB, and three output circuits 5m are shown by way of example.

One output circuit 5m has two output units 5mA, 5mB. Here, the external drive terminals 3mA, 3mB are terminals for driving source electrodes of the active matrix type liquid crystal display. The output units 5mA, 5mB, respectively, include latch circuits 50mA, 50mB that latch display data supplied from the processing circuit 6, tone level selecting circuits 51mA, 51mB that decode the display data latched by the latch circuits 50mA, 50mB and select a tone level voltage signal, output amplifiers 52mA, 52mB that amplify tone level voltage signals which have been output from the tone level selecting circuits 51mA, 51mB, and select switches 53mA, 53mB that select one of the outputs with opposite polarities of two output amplifiers and output it to the corresponding external drive terminals 3mA, 3mB. The output unit 5mA includes a latch circuit 50mA, a tone level selecting circuit 51mA, an output amplifier 52mA, and a select switch 53mA. The output unit 5mB includes a latch circuit 50mB, a tone level selecting circuit 51mB, an output amplifier 52mB, and a select switch 53mB. Here, the output units 5mA, 5mB are not arranged on a per-unit basis; instead, component circuits of each output unit are arranged together on a per-function basis. For example, the select switches 53m, 53mB are arranged in line in the Y direction, whereas the output amplifiers 52mA, 52mB, the tone level selecting circuits 51mA, 51mB and the latch circuits 50mA, 50mB are arranged in line in the X direction in the mentioned order.

A large number of output circuits 5m, each occupying one circuit cell, are laid out. One output circuit occupies a rectangular circuit cell having a width of 5mW.

Also, a large number of ESD protection circuits 4mA, 4mB, each occupying one circuit cell, are laid out. Each ESD protection circuit 4mA, 4mB occupies a rectangular circuit cell and the width 4mW of two ESD protection circuits is larger than the width 5mW of the output circuit 5m. The layout pitch for the ESD protection circuits 4mA, 4mB is equal to the layout pitch for the external drive terminals 3mA, 3mB. By this relationship, the output protection circuits and the external drive terminals which are mutually coupled are associated in one-to-one correspondence in the X direction within the range of the width of 4W. On the other hand, because 4mW>5mW, positional relationship between the output units 5mA, 5mB of the output circuits and the external drive terminals 3mA, 3mB which are mutually coupled is as follows: distance between an output unit and its corresponding external drive terminal gradually increases, as the number of array columns from base ends increases in the Y direction. The routing distance in the Y direction of wiring lines 8 coupling the output units 5mA, 5mB of the output circuits 5m and the external drive terminals 3mA, 3mB becomes longer, the distance relative to each other becomes farther. The wiring region 9m for this purpose is provided between the ESD protection circuits and the select circuits.

When making a comparison between the first embodiment in which each set of external drive terminals in three columns is laid out in a staggered arrangement and the second embodiment in which each set of external drive terminals in two columns is laid out in a staggered arrangement, if there is a limit of the length in the X direction of the output circuits 5, 5m and the output circuits 5, 5m extend in the X direction up to the limit, 5mW is shorter than 5W. If a pitch for the external drive terminals can be set so that a minimum necessary interval (for example, 11 μm) can be provided between adjacent terminals in each set, the width dimension of 4W remains unchanged even if the number of columns in which the terminals are laid out in a staggered arrangement in the Y direction increases. However, the layout pitch for the entire array of external drive terminals becomes smaller, as the number of columns in which the terminals are laid out in a staggered arrangement in the Y direction increases. Therefore, it will be expedient that the number of columns in which the terminals are laid out in a staggered arrangement should be increased commensurate with a narrow pitch designed for input terminals or input wiring lines of a driven device to be coupled to the external drive terminals. The smaller the number of columns in which the terminals are laid out in a staggered arrangement, a lager empty space region 6A can be reserved.

In other respects, the second embodiment can achieve a similar positive effect as is the case for the first embodiment.

Third Embodiment

Figure 6:
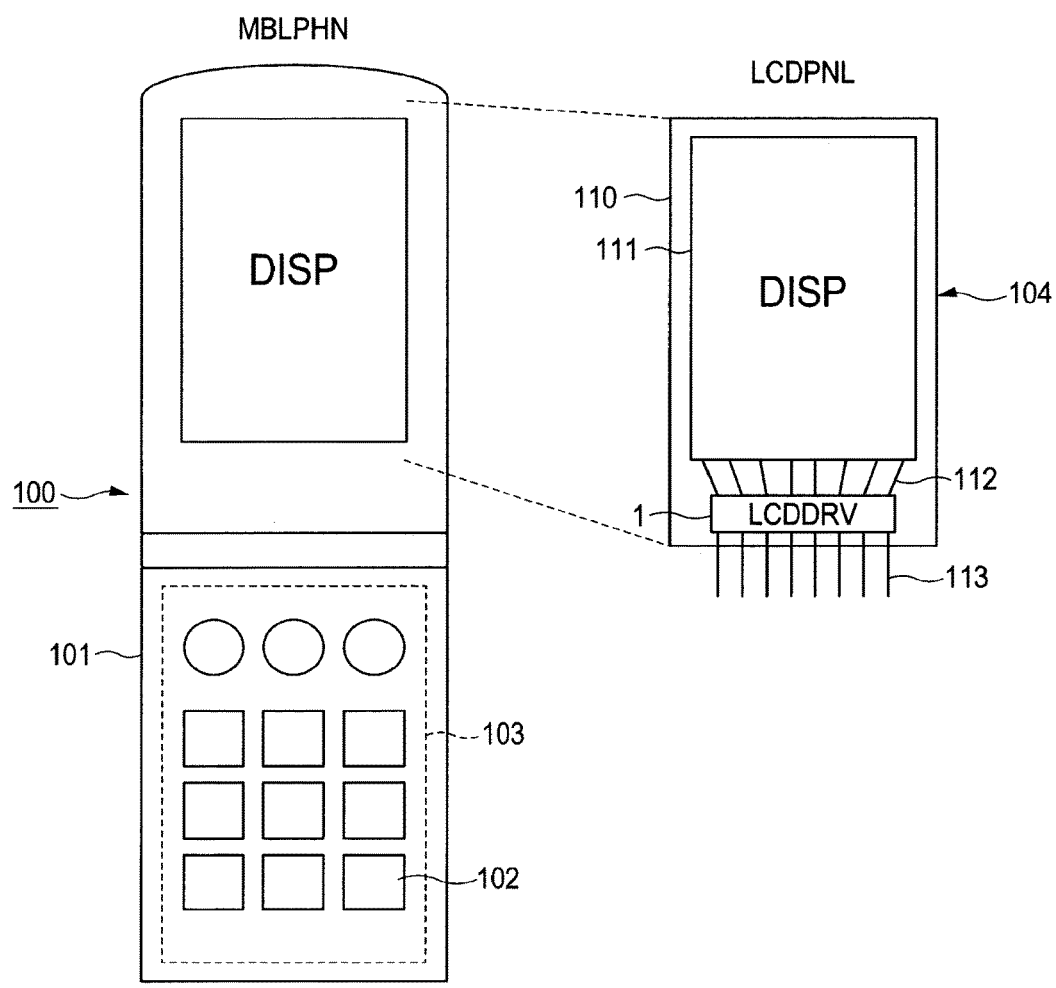
FIG. 6 is a schematic diagram illustrating a mobile phone as an example of a mobile information terminal as a third embodiment of the present invention.

FIG. 6 illustrates a mobile phone as a third embodiment of the present invention. The mobile phone (MBLPHN) 100, which is an example of a mobile information terminal, includes an input unit 102 that accepts user input such as key in operation, a data processing unit 103 that performs data processing according to an input signal from the input unit 102, and a display panel (LCDPNL) 104 as a display unit for display under control of the data processing unit 103 in the mobile phone's casing 101. The input unit 102 is not limited to a key in structure and a touch panel or the like may be used as the input unit. The data processing unit 103 involves, but not limited to, a baseband processing unit for mobile communication and application processing units for display control, authentication for communication, etc. The display panel 104 includes an active matrix type liquid crystal display (DISP) 111 formed over a glass substrate 110, source electrode lines 112 made of, for example, an ITO film (a transparent conductive film of indium oxide with an additive of oxide) or the like, lead out from the active matrix type liquid crystal display 11, and formed over the glass substrate 110, and a liquid crystal display driver (LCDDRV) 1, as a semiconductor integrated circuit, coupled to the source electrode lines 112 and mounted over the glass substrate 110. The liquid crystal display driver 1 has the configuration described in the first embodiment or the second embodiment. Reference numeral 113 denotes collectively interface cables for coupling the liquid crystal display driver 1 to the application processing units.

Because, as is evident from the foregoing description, the liquid crystal display driver 1 sufficiently complies with the requirement that the external drive terminals 3A, 3B, 3C (3mA, 3mB) should be arranged at a narrower pitch, the inventive feature in terms of narrower pitch layout of the external drive terminals 3A, 3B, 3C (3mA, 3mB) of the liquid crystal display driver 1 for driving pixels of the active matrix type liquid crystal display 111 can contribute to the realization of a smaller display panel and, moreover, a smaller mobile phone in order to meet size reduction and enhanced definition of the active matrix type liquid crystal display 111.

While the invention made by the present inventors has been described specifically based on its embodiments hereinbefore, it will be appreciated that the present invention is not limited to the described embodiments and various modifications may be made thereto without departing from the scope of the invention.

For example, mapping three output units of an output circuit 5 to external drive terminals to which they are coupled respectively is not limited to mapping them to the terminals 3A, 3B, 3C in a set laid out in three columns in every case. The output units may be mapped to the terminals in a set laid out in a triangle arrangement in two columns out of three columns.

The arrangement of select switches 53A, 53B, 53C is not limited to arranging them in line in the Y direction; they may be arranged in line in the X direction.

Mobile information terminal is not limited to a mobile phone; it may be a terminal for communication via a wireless LAN instead of mobile communication or a terminal for stand-alone use without any communication function.

The number of columns in which each set of external drive terminals is laid out in a staggered arrangement is not limited to two or three columns; a number of columns more than three can be adopted, as appropriate.

What is claimed is:

1. A semiconductor device comprising:
    a plurality of sets of external drive terminals arranged in a marginal region along one long side of a rectangular semiconductor substrate;
    a plurality of sets of ESD protection circuits also arranged in the marginal region and coupled to the corresponding sets of said external drive terminals;
    a plurality of output circuits coupled to the corresponding sets of said external drive terminals; and
    a plurality of external interface terminals arranged in a marginal region along the other long side of said semiconductor substrate;
    wherein the sets of said external drive terminals are arranged such that each set of the external drive terminals in a plurality of n columns in a Y direction is laid out in a staggered arrangement in which the positions of the external drive terminals in adjacent columns are shifted with respect to each other,
    wherein each output circuit comprises n output units associated with n external drive terminals of each set, the output circuits being arranged in a plurality of different columns in the Y direction, each column including a single output circuit that extends in an X direction perpendicular to the Y direction, and
    wherein a layout pitch for said external drive terminals is smaller than a layout pitch for said external interface terminals.

2. The semiconductor device according to claim 1, wherein the positions of the external drive terminals in adjacent columns overlap with respect to each other.

3. The semiconductor device according to claim 1, wherein each output unit includes a plurality of component circuits that are arranged together on a per-function basis in each column.

\* \* \* \* \*